United States Patent
Ando et al.

(10) Patent No.: US 10,093,249 B2
(45) Date of Patent: Oct. 9, 2018

(54) ELECTRIC DEVICE MOUNTING STRUCTURE

(71) Applicants: MITSUBISHI JIDOSHA KOGYO KABUSHIKI KAISHA, Tokyo (JP); MITSUBISHI JIDOSHA ENGINEERING KABUSHIKI KAISHA, Okazaki-shi, Aichi (JP)

(72) Inventors: Toshihiko Ando, Okazaki (JP); Yoshio Hiraiwa, Okazaki (JP)

(73) Assignees: MITSUBISHI JIDOSHA KOGYO KABUSHIKI KAISHA, Tokyo (JP); MITSUBISHI JIDOSHA ENGINEERING KABUSHIKI KAISHA, Okazaki-Shi (JP)

( * ) Notice: Subject to any disclaimer, the term of this patent is extended or adjusted under 35 U.S.C. 154(b) by 0 days.

(21) Appl. No.: 15/686,789

(22) Filed: Aug. 25, 2017

(65) Prior Publication Data

US 2018/0056901 A1    Mar. 1, 2018

(30) Foreign Application Priority Data

Aug. 26, 2016 (JP) ................................. 2016-166286

(51) Int. Cl.
| | |
|---|---|
| *H05K 5/00* | (2006.01) |
| *B60R 16/023* | (2006.01) |
| *B60L 15/00* | (2006.01) |
| *B60L 11/18* | (2006.01) |

(52) U.S. Cl.
CPC ...... *B60R 16/0239* (2013.01); *B60L 11/1812* (2013.01); *B60L 15/007* (2013.01); *H05K 5/0073* (2013.01); *B60L 11/1803* (2013.01); *B60L 2210/10* (2013.01); *B60L 2210/40* (2013.01); *B60Y 2306/01* (2013.01)

(58) Field of Classification Search
CPC .......................... B60R 16/0239; H05K 5/0073
See application file for complete search history.

(56) References Cited

U.S. PATENT DOCUMENTS

| | | | |
|---|---|---|---|
| 6,728,110 B2* | 4/2004 | Koyama | H05K 5/0073 361/752 |
| 7,161,087 B2* | 1/2007 | Hunkeler | H05K 5/0204 174/138 G |

(Continued)

FOREIGN PATENT DOCUMENTS

| | | |
|---|---|---|
| DE | 102012100977 B3 | 7/2013 |
| EP | 1992513 A1 | 11/2008 |

(Continued)

*Primary Examiner* — Hung V Ngo
(74) *Attorney, Agent, or Firm* — Birch, Stewart, Kolasch & Birch, LLP

(57) ABSTRACT

A mounting structure for an electric device of a vehicle includes a case body configured to accommodate the electric device inside the case body, at least one fixing portion provided continuously with the case body and configured to be fixed to a vehicle body of the vehicle, and at least one hollow portion disposed between the case body and the fixing portion. When a load from the vehicle body is transmitted to the fixing portion, the hollow portion is deformed and/or broken by the load so that the load can be absorbed. Thus, transmission of the load to the case body can be suppressed.

9 Claims, 7 Drawing Sheets

(56) References Cited

U.S. PATENT DOCUMENTS

| | | | | |
|---|---|---|---|---|
| 7,255,597 B2* | 8/2007 | Nakamura | ........... | H05K 5/0073 439/535 |
| 7,654,864 B2* | 2/2010 | Ishiguro | ............... | H05K 5/0204 248/548 |
| 8,338,720 B2* | 12/2012 | Burgi | ................... | H05K 5/0073 174/541 |
| 8,704,109 B2* | 4/2014 | Demma | ............. | B60R 16/0239 174/541 |
| 9,204,566 B2* | 12/2015 | Balk | .................... | H05K 5/0073 |
| 9,365,165 B2* | 6/2016 | Koyama | ................. | B60R 11/00 |
| 2006/0292902 A1* | 12/2006 | Yamamoto | .......... | B60R 16/0215 439/76.2 |
| 2013/0205560 A1* | 8/2013 | Ghannam | ........... | B60R 16/0239 29/426.5 |
| 2017/0210307 A1* | 7/2017 | Meyers | ............... | B60R 16/0239 |

FOREIGN PATENT DOCUMENTS

| | | | |
|---|---|---|---|
| JP | 2015-189365 A | 11/2015 | |
| WO | WO 2011/061571 A1 | 5/2011 | |
| WO | WO 2012-104721 A1 | 8/2012 | |
| WO | WO 2014/140412 A1 | 9/2014 | |

* cited by examiner

ELECTRIC DEVICE MOUNTING STRUCTURE

CROSS-REFERENCE TO RELATED APPLICATION

The present application claims priority from Japanese Patent Application No. 2016-166286 filed on Aug. 26, 2016, the entire content of which is incorporated herein by reference.

FIELD OF INVENTION

The present invention relates to a structure for mounting an electric device to a vehicle body.

RELATED ART

Recently, electric vehicles (EVs) in each of which drive wheels are driven by a drive motor, or hybrid vehicles each of which is designed to use a drive motor and an engine in combination to obtain power for driving the vehicle have been developed and put into practical use. As the hybrid vehicles, not only hybrid electric vehicles (HEVs) in each of which a power generator is driven by an engine to generate electric power to thereby charge a battery for feeding electric power to a drive motor, but also plug-in hybrid electric vehicles (PHEVs) in each of which a battery can be charged even by an external commercial power supply have been developed and put into practical use.

In such an electric vehicle, a DC-AC converter (inverter) for driving a drive motor is mounted. The inverter generally has high-voltage electric components housed inside a case made of a casting. The case of the inverter is fixed to a member through a mount material. The member is a skeleton member of a drive system room of the vehicle.

When an external impact is imposed on the vehicle due to collision etc., an impact load from the member is transmitted to the case of the inverter from a fixing portion. There is therefore a fear that the case may be damaged. In a technique according to the related art, a bendable portion is formed in a portion of the member to which the case of the inverter is fixed. When an impact load is input, the bendable portion is bent so that the inverter can be retracted not to interfere with another member. As a result, damage of the case can be avoided (see, e.g., JP 2015-189365A).

Since the bendable portion is bent to move the case and retract the inverter, the fixing portion and the case may be broken after the retraction depending on the magnitude of the impact load. Thus, there is a fear that the case may be damaged.

SUMMARY

Illustrative aspects of the present invention provide an electric device mounting structure according to which a case body can be suppressed from being damaged by a load from a vehicle body.

According to an illustrative aspect of the present invention, the structure includes a case body configured to accommodate the electric device inside the case body, at least one fixing portion provided continuously with the case body and configured to be fixed to a vehicle body of the vehicle, and at least one hollow portion disposed between the case body and the fixing portion.

DETAILED DESCRIPTION

Figure 1:
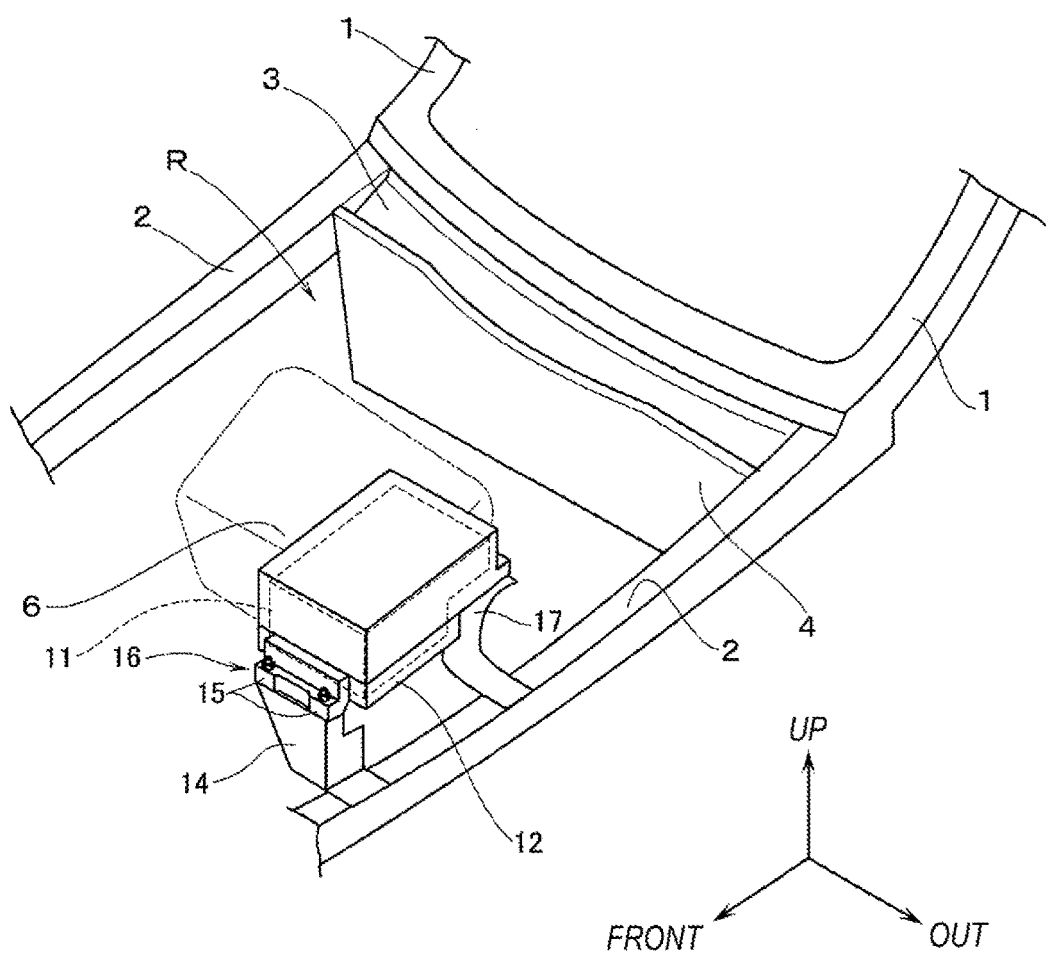
FIG. 1 is a perspective view of a front portion of a vehicle in which an inverter (in a case body) is supported by an electric device mounting structure according to an embodiment of the present invention.

An overall structure according to an embodiment of the present invention for mounting an electric device will be described with reference to FIGS. 1 and 2. FIG. 1 is a front perspective view of a power unit room (an engine room) to illustrate a state in which a case body accommodating an inverter inside is supported by the electric device mounting structure according to the embodiment of the present invention, and FIG. 2 is an exploded perspective view in which the case body is detached.

Figure 2:
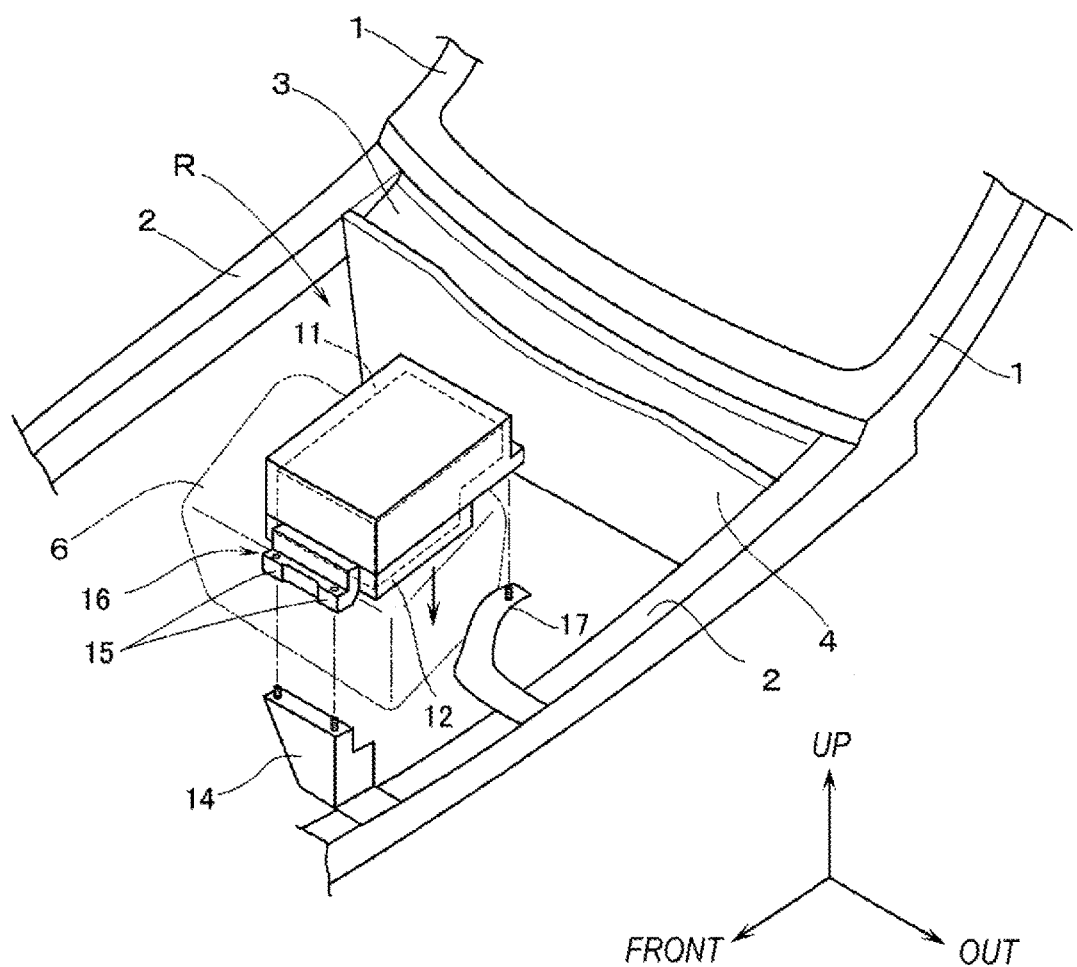
FIG. 2 is another perspective view of the front portion of the vehicle in which the inverter (in the case body) is detached.

As shown in FIGS. 1 and 2, upper frames 2 are connected to left and right front pillars 1 respectively. The upper frames 2 extend to the front of a vehicle body. The upper frames 2 paired with each other are disposed on opposite sides in a vehicle width direction. The front pillars 1 are coupled to each other by a cowl top panel 3. A dash panel 4 is disposed below the cowl top panel 3. Thus, the power unit room R is separated from a vehicle cabin.

A power unit 6 of a drive motor, an engine etc. is mounted in the power unit room R. In addition, a DC-AC converter (inverter) 11, as an electric device for driving the drive motor, is mounted in a state in which it is accommodated inside a case body 12. The case body 12 is fixed to one of the upper frames 2 serving as a vehicle body side.

That is, a front attachment bracket 14 is fixed to a vehicle front side of the upper frame 2. At least one fixing portion 15 is provided at one or a plurality of places of the case body 12. In the Example, fixing portions 15 having bolt holes are provided at two places on the vehicle front side of the case body 12. The fixing portions 15 are formed integrally with the case body 12 through a fixing bracket 16. The vehicle front side of the case body 12 is fixed to the front attachment bracket 14 through the fixing portions 15.

In addition, a rear attachment bracket 17 is fixed to a vehicle rear side of the upper frame 2. The vehicle rear side of the case body 12 is fixed to the rear attachment bracket 17 through not-known metal fittings. Thus, the inverter 11 accommodated inside the case body 12 is fixed to the vehicle body side (upper frame 2).

A hollow portion is disposed in the fixing bracket 16 between the case body 12 and the fixing portions 15. When a load from the vehicle body (load from the front) is transmitted to the fixing portions 15 of the fixing bracket 16, the hollow portion (fragile portion) disposed thus is deformed and/or broken to absorb the load. Thus, transmission of the load to the case body 12 can be suppressed to the minimum.

Figure 3:
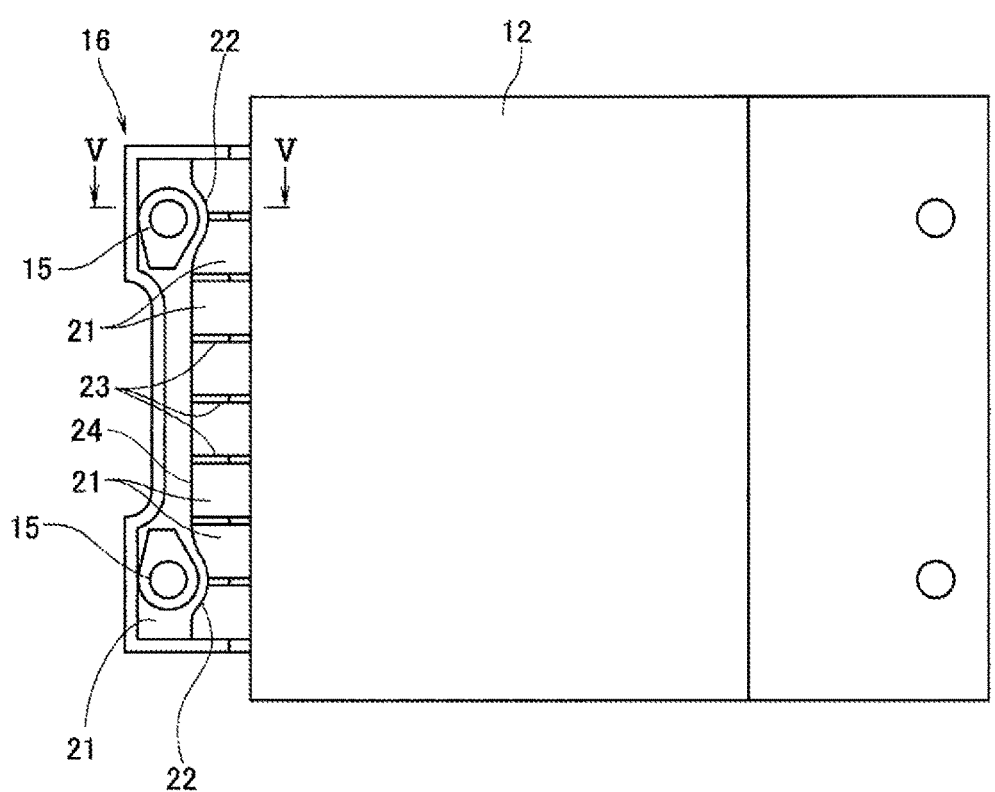
FIG. 3 is a bottom view of the case body.
Figure 4:
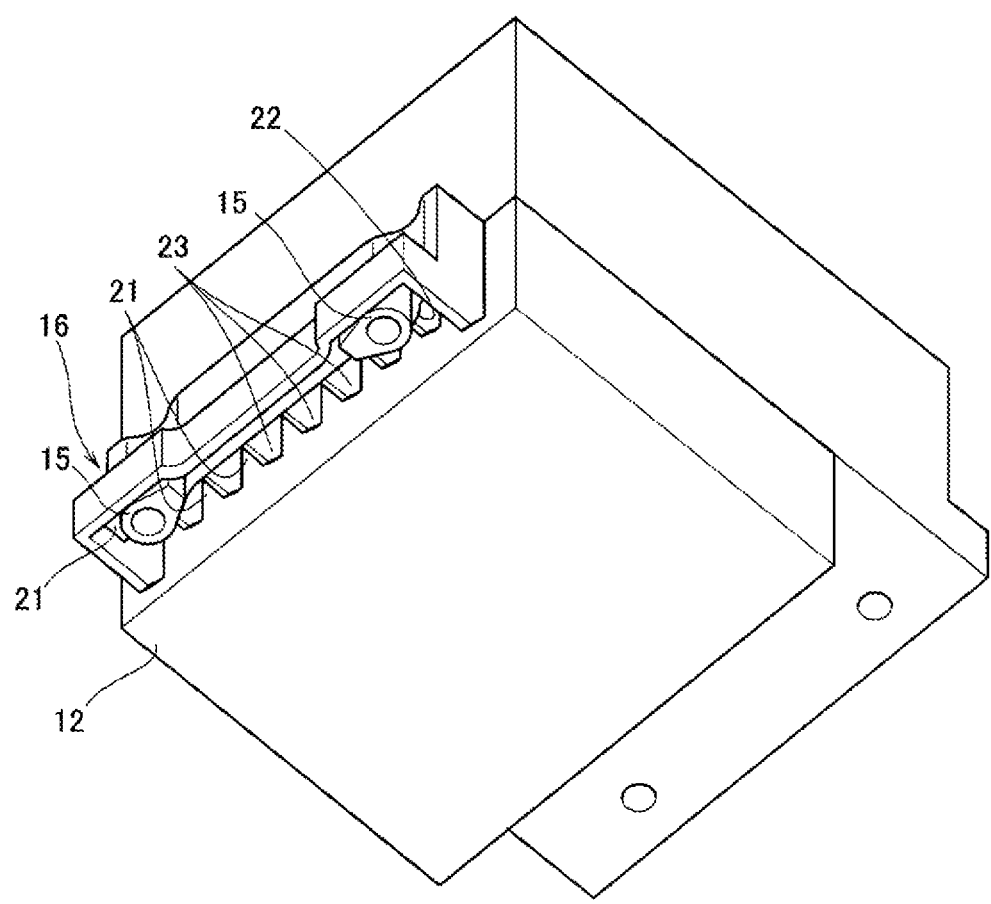
FIG. 4 is a bottom perspective view of the case body, illustrating fixing portions.
Figure 5:
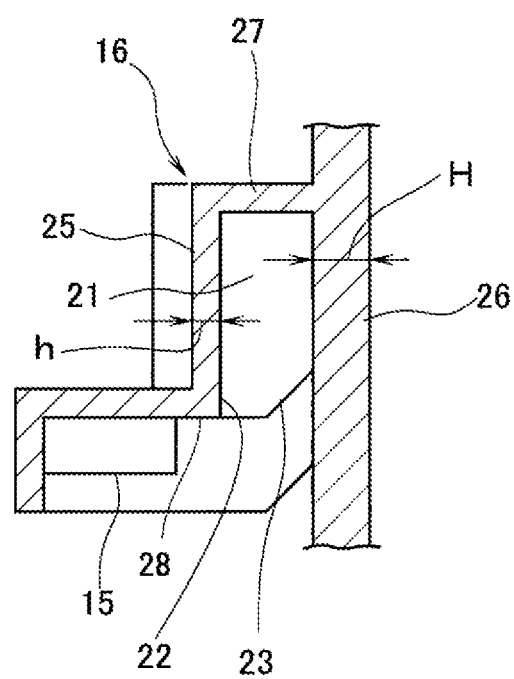
FIG. 5 is a sectional view taken along the line V-V in FIG. 3.

The structure for mounting an electric device (the inverter 11 in the present example) will be described in more detail with reference to FIGS. 3 to 5. FIG. 3 is a bottom view of the case body. FIG. 4 is a bottom perspective view of the case body 12 illustrating the fixing portions 15. FIG. 5 is a sectional view of taken along the line V-V in FIG. 3 including a section of one of the fixing portions 15.

As shown in FIGS. 3 to 5, the fixing bracket 16 between the case body 12 and the fixing portions 15 is configured to connect the fixing portions 15 at the two places continuously. At least one hollow portion 21 is disposed on a back side of the fixing bracket 16. In the Example, the fixing portions 15 at the two places are connected to each other through the fixing bracket 16 having a series of hollow portions 21.

In the present example, a curved wall portion 22 bulging toward the case body 12 is formed on a case body 12 side of each of the fixing portions 15. The hollow portions 21 are also disposed between the case body 12 and the curved wall portions 22. When a plurality of ribs 23 each extending in a front/rear direction of the vehicle are disposed in the vehicle width direction, the hollow portions 21 of the present example are provided at a plurality of places in the width direction of the fixing bracket 16. That is, the hollow portions 21 are disposed three-dimensionally.

As shown in FIG. 5, a thickness h of a vehicle front side wall 25 for forming the hollow portions 21 is formed to be thinner than a thickness H of a wall 26 on the case body 12 side. Therefore, when a load acts rearward from the front of the vehicle, a portion of the vehicle front side wall 25 (e.g., an upper end of the wall 25) is deformed and/or broken earlier than the wall 26 on the case body 12 side. Accordingly, deformation and/or breakage of the case body 12 can be suppressed.

The ribs 23 are disposed between the case body 12 and the fixing portions 15 so that at least one hollow portion 21 can be provided. Accordingly, deformation and/or breakage caused by the load can be allowed while rigidity for supporting the case body 12 inside which the inverter 11 is accommodated is ensured.

In the example described above, the case body 12 is made by, for example, aluminum casting. The case body 12 is cast and manufactured integrally with the fixing portions 15 (bolt insertion holes) and the hollow portions 21. In addition to the inverter 11 for driving the drive motor, a DC-DC converter, a charging device, a battery pack etc. can be applied as the electric device accommodated inside the case body 12.

A behavior of the mounting structure for the inverter 11 will be described primarily with reference to FIGS. 6 and 7 (partially with reference to FIG. 3).

Figure 6:
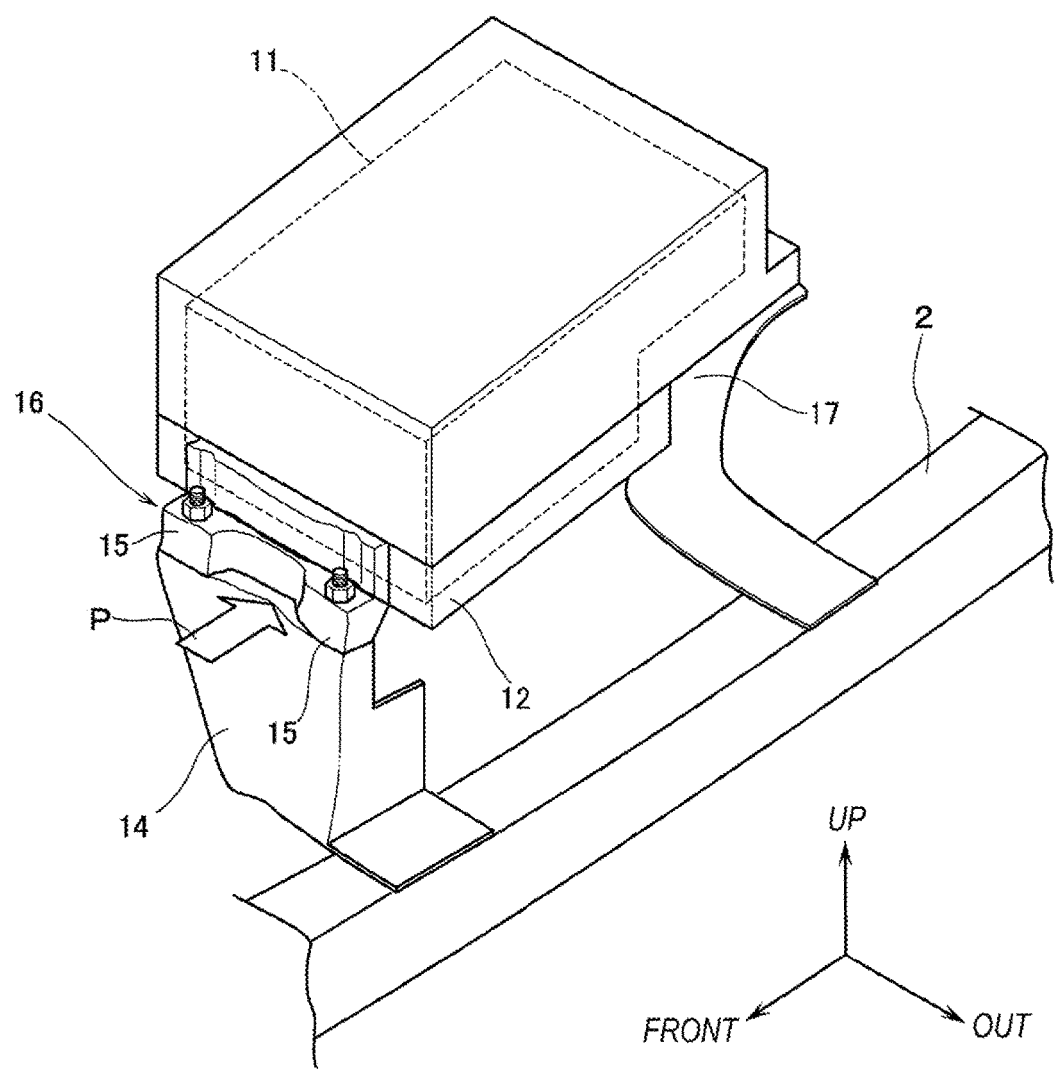
FIG. 6 is an external view of the mounting structure when a load is input.

FIG. 6 is an external view of the mounting structure when a load is input from the front. FIG. 7 is a sectional view of the mounting structure when the load is input from the front.

Figure 7:
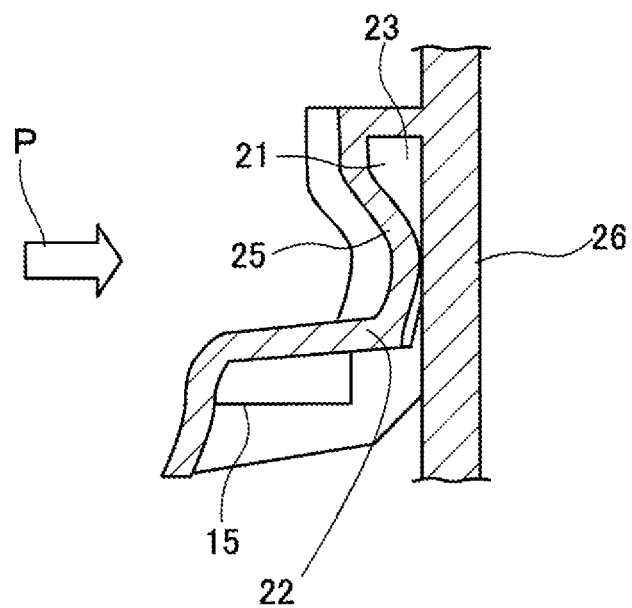
FIG. 7 is a sectional view of the mounting structure when the load is input.

As shown in FIGS. 6 and 7, when the load P from the front of the vehicle body is transmitted to the fixing portions 15 of the fixing bracket 16 in the mounting structure for the inverter 11 having the aforementioned configuration, the hollow portions 21 (fragile portions) are deformed and/or broken by the load so that the load can be absorbed. Thus, transmission of the load from the vehicle body to the case body 12 can be suppressed to the minimum. Therefore, damage of the case body 12 caused the load from the vehicle body can be suppressed.

In addition, the plurality of (two in the present example) fixing portions 15 are connected to one another through the series of the hollow portions 21. Accordingly, when a load P is input to one of the fixing portions 15, the load P can be absorbed by the series of the hollow portions 21 as a whole (stress in reaction to the load P can be dispersed). As a result, transmission of the load from the vehicle body can be suppressed regardless of the input place of the load P.

In addition, the curved wall portions 22 are formed on the case body 12 sides of the fixing portions 15. Accordingly, the hollow portions 21 are provided three-dimensionally so that the hollow portions 21 can absorb the load P in multiple directions (radially) in dispersed manner. As a result, transmission of the load P from the vehicle body side can be suppressed regardless of the input direction of the load P. In other words, loads P from different directions can be absorbed and transmission of any load P from any direction can be suppressed.

In the mounting structure for the inverter 11 described above, when the load P is input from the front of the vehicle, the hollow portions 21 (fragile portions) can be deformed and/or broken to absorb the load P. Accordingly, the case body 12 moves relative to the fixing portions 15 (movement of an absolute position of the case body 12 is suppressed to the minimum) so that damage of the case body 12 can be avoided.

The fixing bracket 16 may include a flat wall portion 24 as shown in FIG. 3, and may further include an upper wall 27 between the front wall 25 and the rear wall 26, and a lower wall 28 as shown in FIG. 5.

What is claimed is:

1. A structure for mounting an electric device of a vehicle, the structure comprising:
   a case body configured to accommodate the electric device inside the case body, the case body having a wall extending in a vertical direction;
   a fixing bracket extending from the wall, the fixing bracket having a vehicle front side wall that extends parallel to the wall of the case body in the vertical direction, the vehicle front side wall and the wall of the case body defining a hollow portion therebetween;
   at least one fixing portion provided in the fixing bracket and configured to fix the case body to a vehicle body of the vehicle; and
   at least one hollow portion disposed between the vehicle front side wall and the wall of the case body,
   wherein the at least one fixing portion is provided at a side opposite to the wall of the case body with respect to the vehicle front side wall.

2. The structure according to claim 1, wherein the at least one fixing portion comprises a plurality of fixing portions provided at a plurality of locations on the fixing bracket,
   wherein the at least one hollow portion comprises a series of hollow portions, and
   the plurality of fixing portions are connected to one another via the series of the hollow portions.

3. The structure according to claim 1, wherein the at least one fixing portion has a curved wall portion bulging toward the wall of the case body, the curved wall portion and the wall of the case body defining a space therebetween.

4. The structure according to claim 3, further comprising:
   ribs extending between the curved wall portion and the wall of the case body.

5. The structure according to claim 1, further comprising:
   ribs extending between the vehicle front side wall and the wall of the case body.

6. The structure according to claim 1, wherein a thickness of the wall of the case body is greater than a thickness of the vehicle front side wall.

7. The structure according to claim 1, wherein the at least one fixing portion is provided at a position lower than the vehicle front side wall.

8. The structure according to claim 1, further comprising:
an upper wall extending in a horizontal direction between an upper end of the vehicle front side wall and the wall of the case body.

9. The structure according to claim 1, further comprising:
at least one of the ribs extends in a vertical direction.

\* \* \* \* \*